United States Patent [19]

Brown

[11] 4,001,869
[45] Jan. 4, 1977

[54] MOS-CAPACITOR FOR INTEGRATED CIRCUITS

[75] Inventor: John L. Brown, Shrewsbury, Mass.

[73] Assignee: Sprague Electric Company, North Adams, Mass.

[22] Filed: June 9, 1975

[21] Appl. No.: 585,278

[52] U.S. Cl. .................. 357/51; 357/14; 357/23; 357/48; 357/54; 357/91; 148/1.5; 148/175

[51] Int. Cl.² .................. H01L 27/04; H01L 29/94

[58] Field of Search .................. 357/51, 54, 48, 91, 357/23, 14

[56] References Cited

UNITED STATES PATENTS

| | | | |
|---|---|---|---|
| 3,402,332 | 9/1968 | Thire | 357/23 |
| 3,654,498 | 4/1972 | Chapron | 357/14 |
| 3,727,151 | 4/1973 | Koehler | 331/116 M |
| 3,860,836 | 1/1975 | Pedersen | 357/14 |
| 3,864,817 | 2/1975 | Lapham, Jr. et al. | 357/51 |
| 3,892,596 | 7/1975 | Bjorklund et al. | 357/51 |
| 3,902,926 | 9/1975 | Perloff et al. | 357/91 |

OTHER PUBLICATIONS

Gay et al, "Capacitors for Monolithic Circuits," SCP and Solid State Technology, Apr. 1966, pp. 24–27.

Primary Examiner—William D. Larkins
Assistant Examiner—Marcus S. Rasco
Attorney, Agent, or Firm—Connolly and Hutz

[57] ABSTRACT

In an integrated circuit formed in a P-type silicon crystal body having an N-type epitaxial layer grown thereon, and having at least one bipolar transistor and at least one ion implanted resistor formed therein, a MOS type capacitor is formed requiring no additional processing steps beyond those normally required to form the resistor and the transistor. The capacitor comprises a first electrode of P-type material, a thin layer of silicon oxide grown simultaneously with the oxide through which the resistor is implanted, and a metal electrode over the oxide dielectric layer. The capacitor of this invention exhibits a relatively high capacitance per unit area of integrated circuit real estate and may be manufactured using only process steps that are required to form bipolar transistors and ion implanted resistors.

8 Claims, 6 Drawing Figures

MOS-CAPACITOR FOR INTEGRATED CIRCUITS

BACKGROUND OF THE INVENTION

This invention relates to integrated metal-oxide-semiconductor (MOS) type capacitors; and more particularly to such a capacitor that is formed in an integrated circuit having at least one bipolar transistor and at least one ion implanted resistor.

Such capacitors are typically formed in an integrated cicuit employing only process steps that are required for forming the other integrated components. In this manner the number of steps required for forming the integrated circuit are minimized. It is well known that the quality of an integrated circuit tends to be degraded and the cost increases as the number of process steps required increases. For reasons that will be explained more fully, the conventional integrated MOS capacitor has an oxide layer that typically ranges in thickness from above 3000 to 6000 angstroms, and it overlies a semiconductor electrode of N-type conductivity when the crystal body is of P-type conductivity, as is almost always the case. The adjacent underlying semiconductor electrode being of N-type conductivity is partly responsible for the dielectric oxide layer being so thick. Thinner oxide layers are desirable to provide a high capacity per unit area of the integrated circuit surface. Many integrated circuits have employed the conventional MOS capacitors that occupied as much as a third of the total area.

It is therefore an object of this invention to provide an integrated MOS capacitor requiring significantly less circuit area than a conventional MOS capacitor having the same capacity value.

It is a further object of this invention to provide a small integrated MOS capacitor that can be formed by processes already required by the other of the integrated components, when such other components include at least one bipolar transistor and at least one ion implanted resistor.

It is yet a further object of this invention to provide an integrated MOS capacitor capable of being formed by routine process steps to a close capacity tolerance.

SUMMARY OF THE INVENTION

In an integrated circuit including at least one bipolar transistor and at least one ion implanted resistor, there is formed a metal-oxide-semiconductor (MOS) type capacitor. The semiconductor capacitor electrode is of P-type conductivity, being capable of being formed simultaneously with the formation of the P-type base of a NPN type transistor or capable of being formed simultaneously with the formation of the P-type isolation walls that define and isolate the epitaxial region containing the elemental integrated components. More generally, when there is included an ion implanted resistor and an integrated transistor that contains a P-type region of moderate to high impurity concentration equivalent to a sheet resistivity of about 300 to 0.1 ohms per square, such as isolated vertical and lateral PNP types or PNPN devices, then the MOS capacitor of this invention may be formed in that integrated circuit entirely by process steps that are already necessary to form the ion implanted resistor and the transistors. The oxide dielectric layer of the capacitor is from 1000 to 3000 angstroms thick, being formed simultaneously with the high quality oxide layer having been grown over the ion implanted resistor body. This thickness of the oxide layer that is suitable for use over ion implanted resistors, is about half the thickness of the oxide layers employed as the dielectric layer in a conventional integrated MOS capacitor having a N-type semiconductor electrode. Therefore the MOS capacitor of this invention requires about half the surface area on the integrated circuit compared with that required for the conventional MOS capacitor of the same capacitance.

DESCRIPTION OF THE PREFERRED EMBODIMENTS

Figure 1:
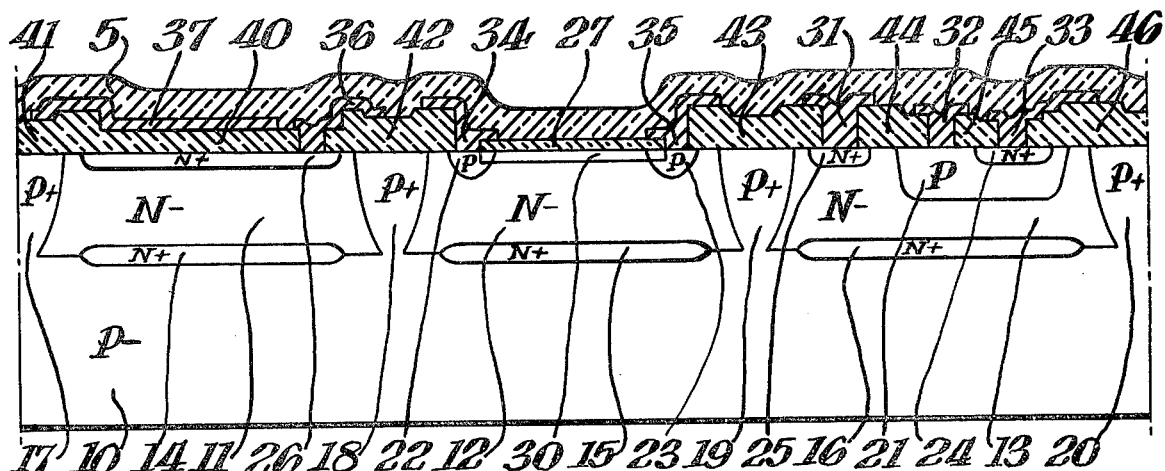
FIG. 1 shows a cross sectional view of a portion of a conventional integrated circuit including a conventional MOS type capacitor.
Figure 3:
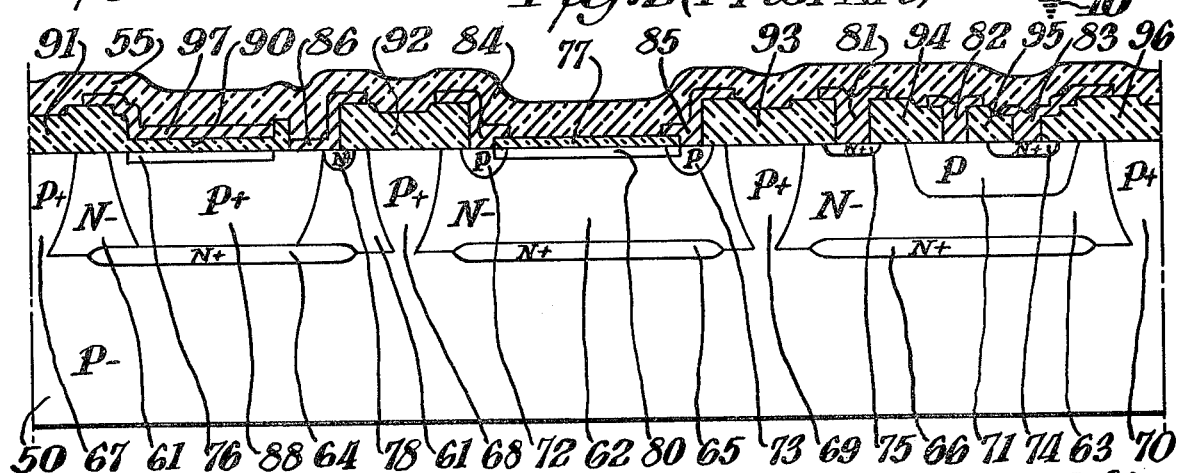
FIG. 3 shows a cross sectional view of a portion of an integrated circuit including a MOS type capacitor of this invention.
Figure 5:
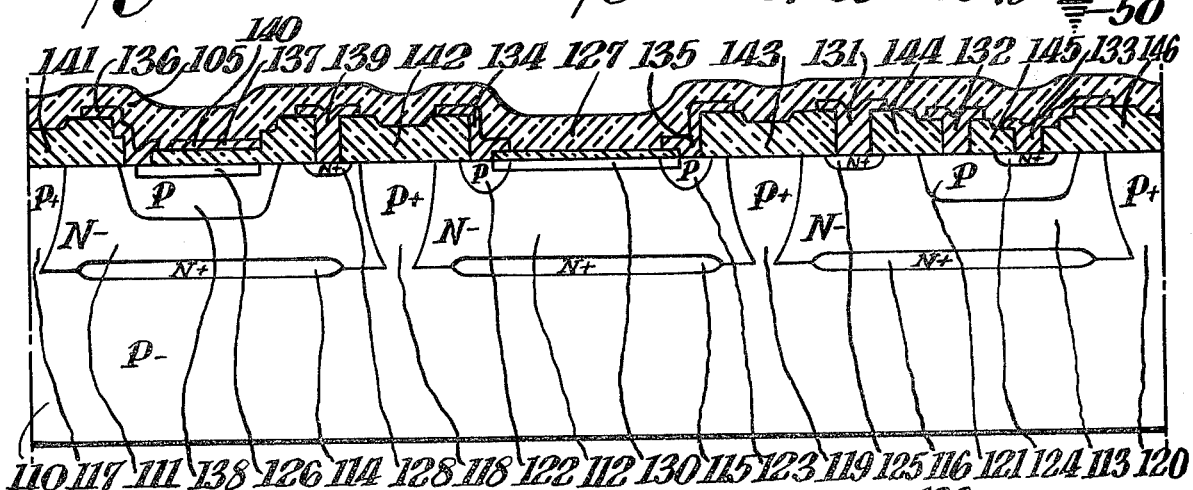
FIG. 5 shows a cross sectional view of a portion of an integrated circuit including another MOS type capacitor of this invention.

The MOS capacitor conventional employed in integrated circuits is illustrated in FIG. 1, along with a typical ionimplanted resistor and a typical NPN transistor, each being formed in separate portions 11, 12 and 13, respectively, of an epitaxial layer. The vertical scale in FIGS. 1, 3 and 5 is shown magnified for clarity. The epitaxial layer typically contains a low concentration of N-type impurities (e.g. from $5 \times 10^{14}$ to $5 \times 10^{17}$ dopant atoms per cubic centimeter), having been grown on a silicon crystal body 10 that is lightly bulk doped with P-type impurities. Buried layers 14, 15 and 16 having a sheet resistivity of about 20 ohms per square contain a heavy concentration of N-type impurities and lie at the interface between the body and the epitaxial layer portions 11, 12 and 13, respectively.

A network of isolation walls 17, 18, 19 and 20 separate and define the epitaxial layer portions 11, 12 and 13. The isolation walls are formed by growing an oxide on the surface of the epitaxial layer, applying a sheet of photo resist thereto, exposing the photo resist sheet to an appropriate light pattern as defined by a light mask, selectively removing the photo resist material in areas over the location of the desired walls, diffusing P-type dopant impurities through the oxide holes into the epitaxial layer and annealing the silicon to drive the impurities through the epitaxial layer. The resistivity of these walls is usually about 4 ohms per square. During the last phase of this heating step it is common practice to admit an oxidizing gas into the furnace so that a new oxide layer is formed over the walls. The silicon wafer is now ready for a second series of photo lithographic etch and diffusion steps that for example are designed to provide the transistor base region 21 and the two P-type resistor contact regions 22 and 23 in epitaxial portion 12.

In a further series of steps, the oxide is again opened in other selected areas and a heavy concentration of N-type impurities is diffused into regions that become the emitter region 24, the collector contact region 25 of the transistor and an electrode region 26 of the capacitor. These regions have a sheet resistivity of about 5 ohms per square.

When the integrated circuit is to include an ion implanted resistor, the oxide is once again opened for selectively exposing the epitaxial region 12 in an area between and including a portion of the resistor contact regions 22 and 23. Again an oxide is grown forming a uniformly thick layer 27 of silicon oxide from between 800 and 3000 angstroms thick over the freshly opened resistor area. A resistor body is then formed by directing high energy P-type ions at the wafer. The ions penetrate the relatively thin oxide layer 27 and become lodged in the underlying epitaxial layer forming a thin resistor region 30 that overlaps regions 22 and 23. The oxide elsewhere is much thicker and does not admit the high energy ions to the wafer body. This ion implantation process for forming a resistor body through a thin oxide layer is sometimes preferred as being more precise and providing a more reliable passivation for the resistor, compared with another standard method wherein the passivating oxide is grown over the resistor region after implantation.

For the purpose of making the necessary ohmic contacts to portions of the integrated components, holes are again opened in the oxide and by a selective deposition means, metal is deposited through the holes overlapping the adjacent oxide to various extents. Thus contacts 31, 32 and 33 are made to the transistor collector, base and emitter regions, respectively. Also contacts 34 and 35 are made to P-type regions 22 and 23, respectively, for terminating the resistor 30. At the same time a contact 36 is made to the N-type electrode region 26. Finally a second capacitor electrode 37 is deposited over electrode 26 being spaced therefrom by a portion 40 of the oxide layer. The MOS capacitor formed in this manner employs the oxide layer portion 40 as the dielectric layer and the capacitance is inversely proportioned to the thickness of this layer.

This above general description of well known methods for forming specialized doped regions in a semiconductor is provided to illustrate how the steps in forming an integrated circuit are normally made minimal in number and are designed to affect the structure of several different elementary components of the integrated circuit simultaneously, and more particularly to illustrate and emphasize how the oxide on the epitaxial surface is repeatedly grown and selectively removed in the normal course of making an integrated circuit.

By the above noted process, the oxide portion 40 is typically 4000 angstroms thick, and usually represents an accumulation of oxide growth during the last phase of the emitter diffusion cycle plus the oxidation step for growing the above noted resistor passivating layer 27. Furthermore, oxide grows at a higher rate over regions of the epitaxial layer such as the capacitor electrode region 26 that contain high concentrations of N-type dopants, especially phosphorous. Also, the fast grown oxide 40 over the N-type capacitor electrode 26 tends to be more porous, to contain more pin holes, and to have a lower voltage withstanding capability per unit thickness than the oxide grown elsewhere. Thus the dielectric oxide in a conventional integrated MOS capacitor is generally of inferior quality and is generally thicker than desired.

The profile of the oxide in oxide layer portions 41, 42, 43, 44, 45 and 46 is shown to vary as can be appreciated from the selective removal and growing steps as described above. An overlayer 5 of glass is normally deposited over the completed integrated circuit by a vapor deposition step to provide physical protection and to insulate the integrated circuit from atmospheric contaminants.

Figure 2:
FIG. 2 shows an equivalent circuit of the capacitor of FIG. 1.

An equivalent circuit diagram of the MOS capacitor structure of FIG. 1 is shown in FIG. 2. The capacitor 48 has a series resistor 26 that represents the resistance of the doped region 26. The capacitor 49 between terminal 36 and the P-body, serving as the ground reference point for the integrated circuit, is the normally reverse biased p-n junction between the epitaxial region 11 and the surrounding P-type material. Capacitor 49 typically has a capacity of 0.07 picofarads per squre mil (1 mil = 0.001 inch) at 5 volts reverse bias. Capacitor 48 typically has a capacity of 0.055 picofarads per square mil, for a dielectric oxide thickness of 4000 angstroms.

A MOS capacitor of this invention is shown in FIG. 3, incorporated in an integrated circuit along with a typical ion implanted resistor and a typical NPN transistor, each being formed in separate portions 61, 62 and 63, respectively, of the epitaxial layer having N-type conductivity. Buried layers 64, 65 and 66 contain a heavy concentration of N-type impurities and lie at the interface between the body and the epitaxial layer portions 61, 62 and 63. A network of isolation walls 67, 68, 69 and 70 separate and define the above noted portions of the epitaxial layer.

The transistor and the ion implanted resistor may be formed by the conventional steps as were described above for making the integrated circuit of FIG. 1. The transistor and resistor, formed in epitaxial layer portions 63 and 62, respectively, as shown in FIG. 2 are identical to those in epitaxial layer portions 13 and 12, respectively, as shown in FIG. 1; and the elementary parts of each are designated in FIG. 2 by numerals that are greater by 50 than the numerals of the corresponding elementary parts in FIG. 1.

As in the capacitor of FIG. 1, the MOS capacitor of FIG. 3 is formed during the formation of the transistor(s) and ion implanted resistor(s) without requiring an additional process step. However, a large region 88 having a heavy concentration of P-type impurities occupies most of the central portion of epitaxial layer 61 and is formed simultaneously with the isolation walls 67, 68, 69 and 70. The P-type dopants in the walls and region 88 are most highly concentrated at the epitaxial surface, the concentration being diminished several order of magnitude at the interface between the epitaxial layer and the lightly P-doped body 50. The buried layer 64 has a high enough concentration of N-type dopants that this region retains an N-type conductivity character and the P-type region 88 is effectively surrounded in the epitaxial region 61 by N-type material as shown.

A small region 78 is heavily doped with N-type impurities during the diffusion step in which the transistor emitter 74 is formed. When the oxide is opened over the resistor body region 80 it is simultaneously opened over a major portion of the region 88 and when the uniformly thick oxide layer 77 of between 800–3000 angstroms is grown over the resistor body region, a similar layer 90 is simultaneously grown over region 88. Furthermore, when P-type ions are implanted into region 80 to form the resistor body, P-type ions are implanted through the oxide layer 90 forming a shallow surface region 76 that now has a concentration of P-type impurities that is greater than that of the bulk of the surrounding region 88 by an amount equal to the concentration of P-type impurities in the resistor body region 80, and having the same depth or thickness. It is noted here, that ion implanted resistors contain a layer of implanted ions ranging from about 0.1 to 0.8 microns thick. Such resistor bodies are distinguishable from diffused resistor bodies that contain a layer of diffused ions of about 2.0 to 4 microns thick.

Simultaneous to the deposition of the metal contacts to the transistor and resistor, metal terminal 86 is formed in contact with region 78 and thus having ohmic contact to the N-type epitaxial region 61, while capacitor electrode 97 is formed over the region 76 being spaced therefrom by the dielectric silicon dioxide layer 90. Metal terminal 86 also contacts a portion of the P-type region 88, effectively shorting the diode formed at the junction of the region 88 and surrounding N-type epitaxial region 61.

In the MOS integrated capacitor illustrated in FIG. 3, the P-type surface region 76 provides a higher conductivity capacitor electrode than would exist if only region 88 served as this electrode, and in principle the implanted region advantageously contributes to reducing the effective series resistance and thus the dissipation factor of the capacitor. However, as a practical matter, the implanted ion density here is usually only a small fraction of the density of P-type dopant atoms already existing in region 88. Thus the addition of region 76 is merely the by-product of the step saving simultaneous method employed here, wherein the oxide layer 77 and 90 are grown over the resistor and capacitor regions prior to the resistor ion implantation step, and the region 76 usually has no practical effect on the electrical characteristics of the capacitor.

This capacitor dielectric oxide layer 90, however, is greatly superior to the counterpart oxide layer 40 of the conventional MOS capacitor of FIG. 1. Most significantly it is thinner, and of better quality. MOS capacitors of this invention have been made and measurements made thereon reveal that 0.11 picofarads per square mil is realized for an oxide thickness of 2000 angstroms while 0.13 picofarads per square mil results from a dielectric thickness of 1700 angstroms. Thinner oxides than 800 angstroms are not desirable, this being about the minimum thickness for adequate passivation and protection of the resistor. Greater thicknesses than 3000 angstroms inhibit through-ion-implantation and are of no practical consequence for use in the capacitor of this invention, since the conventional MOS capacitor is capable of almost as high a capacity per unit area of integrated circuit real estate. The preferred thicknesses are from 1600 to 2200 angstroms.

The capacitor dielectric oxide through which ion implanted resistor bodies are formed are more carefully formed than those for other purposes. The penetration of ions forming the resistor body is inversely related to the oxide thickness and thus it is common practice to carefully grow and control the oxide to a predetermined thin layer so that the implanted resistor body so produced has a predictable resistance. On the other hand, when the resistor body is implanted in a bare silicon surface, the growth of the overlying oxide is again carefully controlled and of a thickness less than 3000 angstroms and preferably less than 2200 angstroms to prevent converting, to a significant depth, the implanted silicon surface and thereby significantly diminishing the thickness of the shallow implanted resistor body region which in turn increases the resistance of the implanted resistor. Therefore, both standard procedures for forming a passivated ion implanted resistor require the formation of a thin high quality silicon oxide film over the resistor body.

Also, the quality of the oxide is required to be high for resistor passivation and thus the special requirements of control and quality of the resistor oxide are compatible with those of the capacitor oxide. Both are advantageously grown over P-type material in this invention as has been explained.

Figure 4:
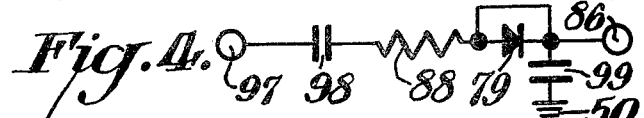
FIG. 4 shows an equivalent circuit of the capacitor of FIG. 3.

An equivalent circuit diagram of the MOS capacitor structure of FIG. 3 is shown in FIG. 4. The capacitor 98 has a series resistor 88 and a series shorted diode 79. The capacitor 99 between terminal 86 and the P body 50, body 50 serving as the integrated circuit ground point, represents the reverse biased junction capacitance between epitaxial region 61 and the body 50.

Another MOS capacitor of this invention is shown in FIG. 5, included in an integrated circuit having in a separate region a typical ion implanted resistor and a typical NPN transistor. These three components are formed in epitaxial layer portions 111, 112 and 113, respectively. The conventional transistor and resistor are identical to those in FIG. 1. The elements of the transistor and resistor in FIG. 5 are designated by numerals that are greater in each case by 100 than the numeral designation of the corresponding elements in FIG. 1. The capacitor of FIG. 5 has a region 138 that is of P-type conductivity and that has been formed simultaneously with the diffusion of the transistor base region 121. The capacitor dielectric oxide layer 140 is of the same thickness and character as the oxide layer 127 that overlies the resistor body 130, having been formed simultaneously, as was described for the capacitor of FIG. 3. Likewise the P-type region 126 was formed by ion implantation through oxide layer 140, simultaneously with the implanting of the resistor body 130. Thus the capacitor comprises electrode 138 (including region 126) and electrode 137 having a silicon dioxide dielectric layer 140 therebetween, and is capable of being terminated at contact 136 and electrode 137. Ohmic contact is had to the N-type epitaxial region 111 by means of the metal contact 139 through region 128 that contains a heavy concentration of N-type impurities.

Figure 6:
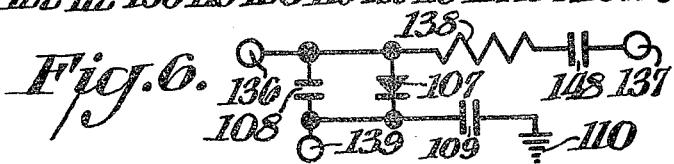
FIG. 6 shows an equivalent circuit of the capacitor of FIG. 5.

An equivalent circuit diagram of the MOS capacitor structure of FIG. 5 is shown in FIG. 6. The MOS capacitor 148 is effectively in series with a resistor 138 that represents the resistance of region 138 in FIG. 5. The diode 107 and the capacitor 108 represent the p-n junction between the region 138 and the N-type epitaxial region 111. The capacitor 109 represents the p-n junction between the body 110 and the N-type epitaxial portion 111. The capacitor 109 has the same characteristics as the equivalent capacitor 49 and 99 in FIGS. 2 and 4, respectively. The capacitor 108 exhibits a capacity per square mil of junction area of about 0.055 picofarads when the diode 107 is back biased at 10 volts. Terminal 139 is provided for applying such a bias voltage.

The MOS capacitors of this invention are seen to offer a capacity per unit area of integrated circuit real estate that may be about two times that of a conventional integrated MOS capacitor, because the oxide dielectric layer is thinner. The MOS capacitor of FIGS. 5 and 6 may be made to have an even higher effective capacitance by connecting electrode terminal 137 to terminal 189 and placing junction capacitor 108 in parallel with MOS capacitor 148. On the other hand, such a connection has the potential disadvantages that the correct exciting polarity must be observed to back bias diode 107 and the capacitor 108 is more voltage and temperature dependent. Also in comparison with the MOS capacitor of FIG. 5, the capacitor of FIG. 6 has a higher effective series resistance 138, since the base doped region 138 typically has a sheet resistivity of about 135 ohms per square, as measured at the surface of the epitaxial layer, while the more heavily doped region 88, in FIG. 3, typically has a resistivity of 4 ohms per square.

What is claimed is:

1. In an integrated circuit including at least one bipolar transistor, at least one resistor and a MOS type capacitor, said integrated circuit being formed in a P-type silicon body having an epitaxial layer of N-type conductivity grown thereon, said transistor having been formed in a first portion of said epitaxial layer, said resistor having been formed by ion implantation of P-type impurities in a second portion of said epitaxial layer at the surface thereof, a silicon oxide film of a uniform thickness between 800 and 3000 angstroms having been grown over and covering said resistor, the improvement comprising said capacitor having one electrode consisting of a P-type region in a third portion of said epitaxial layer and extending to the surface thereof, said oxide film of said uniform thickness having also been grown over said P-type electrode region, and another electrode of metal lying over and being spaced from said P-type region by said film.

2. The integrated circuit of claim 1 wherein said first, second and third portions of said epitaxial layer are defined therein by surrounding isolation walls of P-type conductivity, and wherein said P-type electrode region contains essentially the same concentration of P-type dopants as contained in said walls.

3. The integrated circuit of claim 2 wherein said capacitor additionally includes a buried layer of N-type conductivity being positioned at the interface of said second epitaxial layer portion and said body, and being interposed between said P-type region and said p-type body for providing electrical isolation therebetween.

4. The integrated circuit of claim 2 wherein said metal electrode serves as a first terminal of said capacitor and wherein said capacitor additionally includes a second metal capacitor terminal making ohmic contact to both said P-type electrode regions and the adjacent of said N-type third portion of said epitaxial layer.

5. The integrated circuit of claim 1 wherein said at least one transistor has a standard NPN structure, said first portion serving as the collector thereof, said P-type region in said one epitaxial portion having essentially the same concentration of P-type dopants as the base region of said NPN transistor.

6. The integrated circuit of claim 1 wherein said uniform silicon oxide film is from 1600 angstroms to 2200 angstroms thick.

7. The integrated circuit of claim 1 wherein said P-type region has a portion thereof extending laterally beyond said oxide film of said uniform thickness grown over said P-type region, said P-type region containing a concentration of P-type impurities in a surface region thereof under said oxide film of uniform thickness that is greater than the concentration of P-type impurities in said laterally extending portion of said P-type region by an amount that is equal to the concentration of said P-type impurities in said ion implanted resistor, said surface region having the same thickness as said P-type resistor.

8. The integrated circuit of claim 7 wherein said thickness of said shallow P-type region of said capacitor is from 0.1 to 0.8 microns.

* * * * *